(12) United States Patent
Emura et al.

(10) Patent No.: US 10,910,536 B2
(45) Date of Patent: Feb. 2, 2021

(54) LIGHT EMITTING ELEMENT

(71) Applicant: NICHIA CORPORATION, Anan (JP)

(72) Inventors: Keiji Emura, Anan (JP); Takao Misaki, Anan (JP); Takamasa Sunda, Tokushima (JP); Yoshinori Fukui, Tokushima (JP)

(73) Assignee: NICHIA CORPORATION, Anan (JP)

( * ) Notice: Subject to any disclaimer, the term of this patent is extended or adjusted under 35 U.S.C. 154(b) by 60 days.

(21) Appl. No.: 16/287,545

(22) Filed: Feb. 27, 2019

(65) Prior Publication Data

US 2019/0267527 A1     Aug. 29, 2019

(30) Foreign Application Priority Data

Feb. 27, 2018   (JP) .................................. 2018-033647

(51) Int. Cl.
*H01L 33/62*     (2010.01)
*H01L 27/15*     (2006.01)
(Continued)

(52) U.S. Cl.
CPC ............ *H01L 33/62* (2013.01); *H01L 27/153* (2013.01); *H01L 33/405* (2013.01); *H01L 33/44* (2013.01); *H01L 33/647* (2013.01)

(58) Field of Classification Search
None
See application file for complete search history.

(56) References Cited

U.S. PATENT DOCUMENTS

2012/0074441 A1*  3/2012  Seo .......................... H01L 33/46
                                                       257/91
2014/0319567 A1   10/2014  Yoneda et al.
(Continued)

FOREIGN PATENT DOCUMENTS

JP       2003-110148 A      4/2003
JP       2014-225644 A     12/2014
(Continued)

OTHER PUBLICATIONS

Huang, C-Y "Light extraction enhancement for InGaN/GaN LED by three dimensional auto-cloned photonics crystal" Optics Exp. vol. 17 Iss. 26 Dec. 11, 2009 pp. 23702-23711 (Year: 2009).*

*Primary Examiner* — Grant S Withers
(74) *Attorney, Agent, or Firm* — Squire Patton Boggs (US) LLP (57) ABSTRACT

The light emitting element includes: first and second light emitting cells each including an n-side semiconductor layer, an active layer and a p-side semiconductor layer; a first insulating film covering the first and second light emitting cells, and provided with first p-side and first n-side openings; a wiring electrode connected to the first light emitting cell at the first n-side opening, and connected to the second light emitting cell at the first p-side opening; a first electrode connected to the first light emitting cell; a second electrode connected to the second light emitting cell; a second insulating film provided with a second p-side opening formed above the first electrode, a second n-side opening formed above the second electrode, and a third opening formed above the wiring electrode; a first external connection portion connected to the first electrode; and a second external connection portion connected to the second electrode.

20 Claims, 8 Drawing Sheets

(51) Int. Cl.
*H01L 33/64* (2010.01)
*H01L 33/44* (2010.01)
*H01L 33/40* (2010.01)

(56) References Cited

U.S. PATENT DOCUMENTS

| | | | |
|---|---|---|---|
| 2016/0079483 A1 | 3/2016 | Obata et al. | |
| 2017/0236979 A1* | 8/2017 | Seo | H01L 33/46 257/88 |
| 2017/0256694 A1* | 9/2017 | Lim | H01L 33/44 |
| 2017/0288088 A1* | 10/2017 | Won Cheol | H01L 33/62 |

FOREIGN PATENT DOCUMENTS

| | | |
|---|---|---|
| JP | 2016-012707 A | 1/2016 |
| JP | 2016-012744 A | 1/2016 |
| JP | 2016-062940 A | 4/2016 |

\* cited by examiner

LIGHT EMITTING ELEMENT

CROSS-REFERENCE TO RELATED APPLICATION

This application claims priority to Japanese Patent Application No. 2018-033647, filed on Feb. 27, 2018, the disclosure of which is hereby incorporated by reference in its entirety.

BACKGROUND

The present disclosure relates to a light emitting element.

Japanese Patent Publication No. 2016-12707 discloses a light emitting element in which a plurality of light emitting cells is formed on a substrate, and the plurality of light emitting cells is connected in series by a wiring electrode.

In such light emitting element, light emitting cells are connected in series, and therefore it is difficult to evaluate the electrical properties of each light emitting cell, so that it may be impossible to check whether or not a leakage current or the like occurs.

SUMMARY

In the present disclosure a light emitting element in which although a plurality of semiconductor structures is electrically connected by a wiring electrode, electrical properties in each of a plurality of light emitting cells can be checked.

A light emitting element according to one aspect of the present disclosure includes an insulating substrate; first and second light emitting cells each including an n-side semiconductor layer provided on an upper surface of the substrate, an active layer provided on an upper surface of the n-side semiconductor layer while being absent in some regions of the upper surface of the n-side semiconductor layer, and a p-side semiconductor layer provided on an upper surface of the active layer; a light-reflective electrode provided on an upper surface of the p-side semiconductor layer in each of the first and second light emitting cells; a first insulating film covering the first and second light emitting cells, and provided with a first p-side opening formed above the light-reflective electrode and a first n-side opening formed above some regions of the upper surface of the n-side semiconductor layer for each of the first and second light emitting cells; a wiring electrode provided on an upper surface of the first insulating film, connected to the n-side semiconductor layer of the first light emitting cell at the first n-side opening, and connected to the light-reflective electrode of the second light emitting cell at the first p-side opening; a first electrode provided on the upper surface of the first insulating film, and connected to the light-reflective electrode of the first light emitting cell at the first p-side opening; a second electrode provided on the upper surface of the first insulating film, and connected to the n-side semiconductor layer of the second light emitting cell at the first n-side opening; a second insulating film provided with a second p-side opening formed above the first electrode, a second n-side opening formed above the second electrode, and a third opening formed above the wiring electrode; a first external connection portion connected to the first electrode at the second p-side opening; and a second external connection portion connected to the second electrode at the second n-side opening.

A light emitting element according to another aspect of the present disclosure includes an insulating substrate; three or more light emitting cells connected in series, the three or more light emitting cells including a first light emitting cell positioned at one end of a series circuit and a second light emitting cell positioned at the other end of the series circuit, and each having an n-side semiconductor layer provided on an upper surface of the substrate, an active layer provided on an upper surface of the n-side semiconductor layer while being absent in some regions of the upper surface of the n-side semiconductor layer, and a p-side semiconductor layer provided on an upper surface of the active layer; a light-reflective electrode provided on an upper surface of the p-side semiconductor layer in each of the three or more light emitting cells; a first insulating film covering the three or more light emitting cells, and provided with a first p-side opening formed above the light-reflective electrode and a first n-side opening formed above some regions of the upper surface of the n-side semiconductor layer for each of the three or more light emitting cells; a plurality of wiring electrodes which is provided on an upper surface of the first insulating film, and includes a first wiring electrode connected to the n-side semiconductor layer of the first light emitting cell at the first n-side opening, and a second wiring electrode connected to the light-reflective electrode of the second light emitting cell at the first p-side opening; a first electrode provided on the upper surface of the first insulating film, and connected to the light-reflective electrode of the first light emitting cell at the first p-side opening; a second electrode provided on the upper surface of the first insulating film, and connected to the n-side semiconductor layer of the second light emitting cell at the first n-side opening; a second insulating film having a second p-side opening formed above the first electrode, a second n-side opening formed above the second electrode, and a third opening formed above at least one of the plurality of wiring electrodes; a first external connection portion connected to the first electrode at the second p-side opening; and a second external connection portion connected to the second electrode at the second n-side opening.

According to the above-described configuration, a high-reliability light emitting element can be provided because electrical properties in each of a plurality of light emitting cells can be checked even with the light emitting element in which a plurality of light emitting cells is electrically connected by a wiring electrode.

DETAILED DESCRIPTION OF EMBODIMENTS

Figure 1:
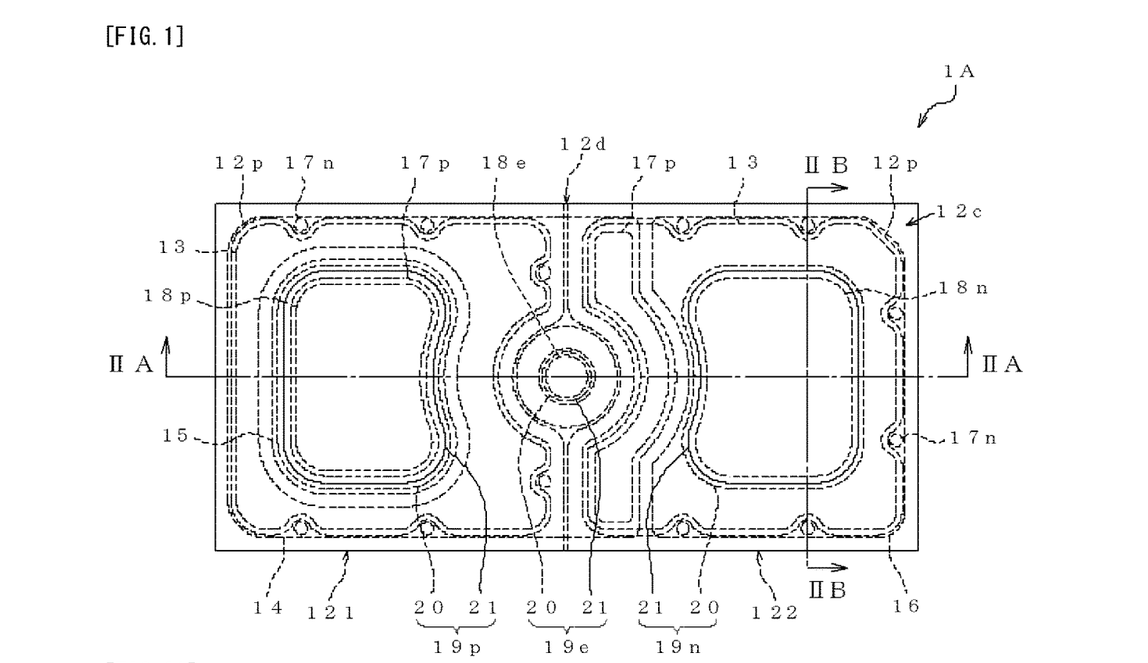
FIG. 1 is a top view schematically showing a configuration of a light emitting element according to a first embodiment.
Figure 2A:
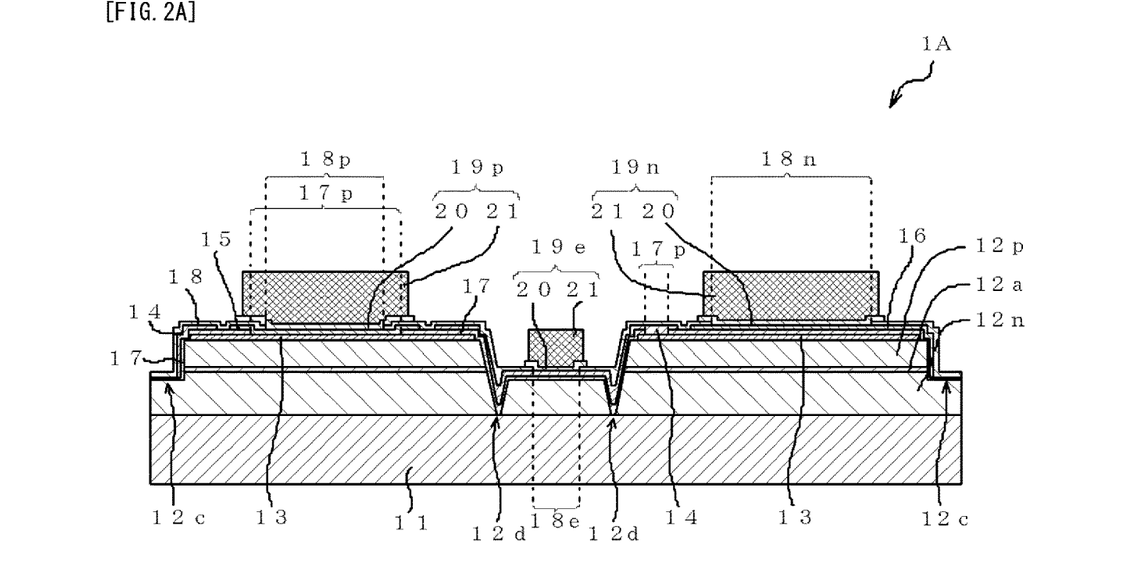
FIG. 2A is a sectional view schematically showing the configuration of the light emitting element according to the first embodiment, and shows a cross-section taken along line IIA-IIA in FIG. 1.
Figure 2B:
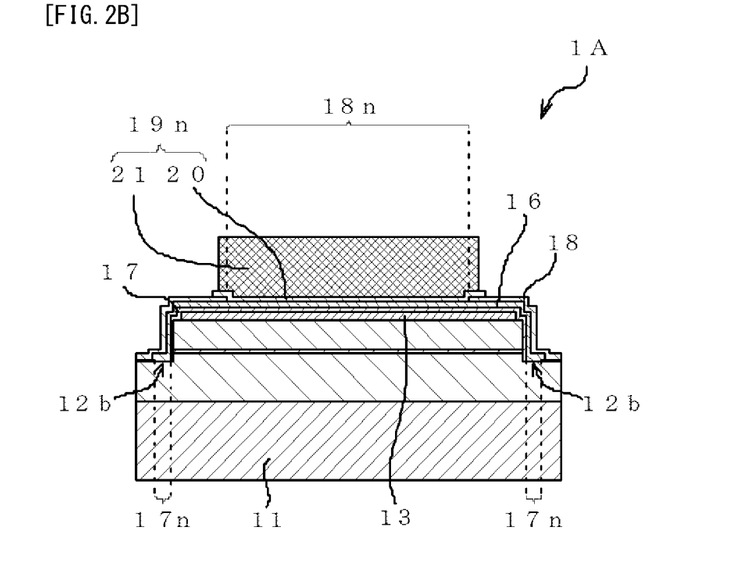
FIG. 2B is a sectional view schematically showing the configuration of the light emitting element according to the first embodiment, and shows a cross-section taken along line IIB-IIB in FIG. 1.
Figure 3:
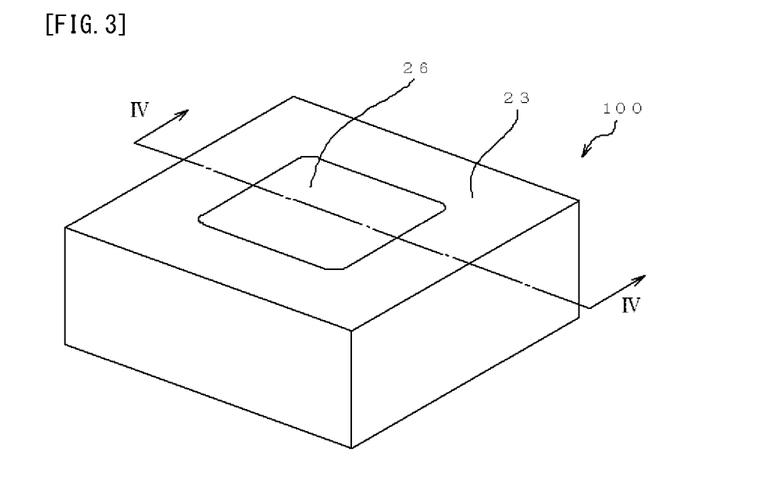
FIG. 3 is a perspective view schematically showing a configuration of a light emitting device according to the first embodiment.
Figure 4:
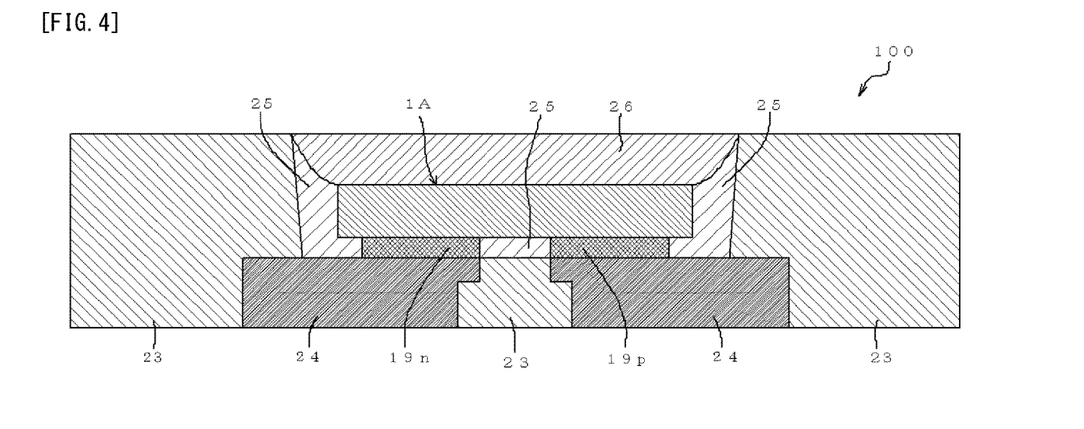
FIG. 4 is a sectional view schematically showing the configuration of the light emitting device according to the first embodiment, and shows a cross-section taken along line IV-IV in FIG. 3.
Figure 5:
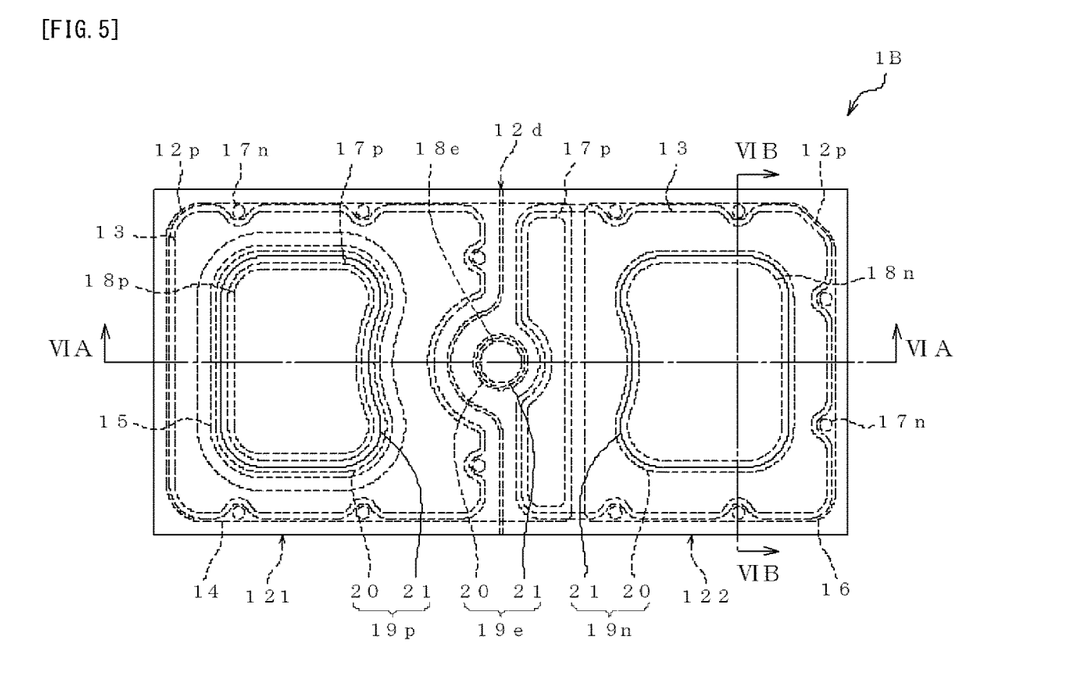
FIG. 5 is a top view schematically showing a configuration of a light emitting element according to a second embodiment.
Figure 6A:
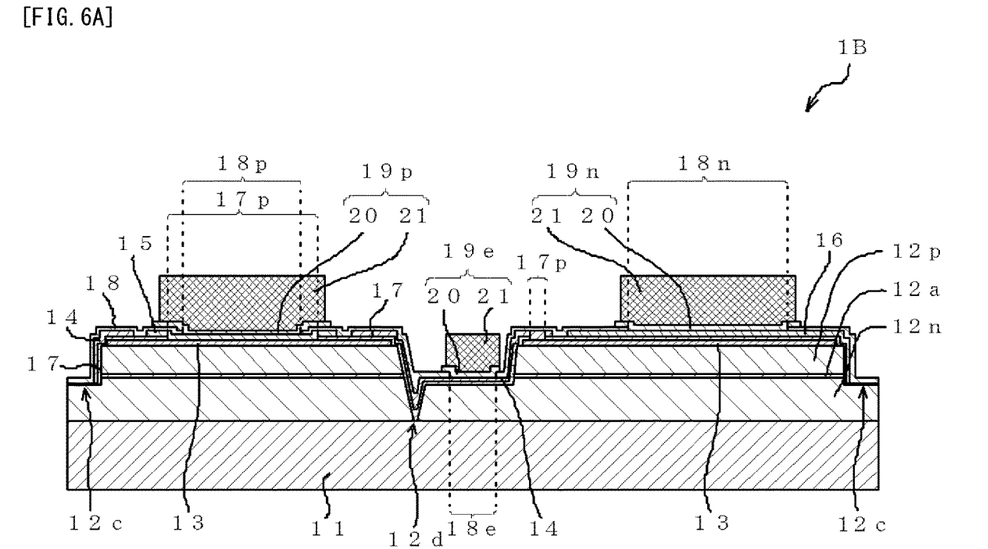
FIG. 6A is a sectional view schematically showing a configuration of a light emitting device according to the second embodiment, and shows a cross-section taken along line VIA-VIA in FIG. 5.
Figure 6B:
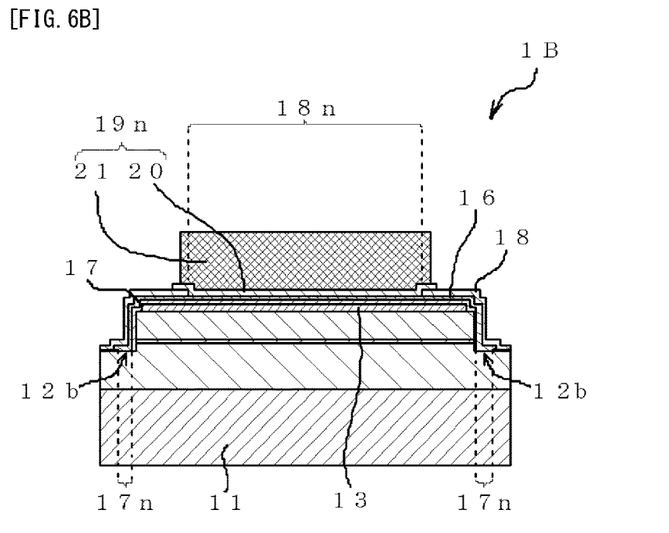
FIG. 6B is a sectional view schematically showing the configuration of the light emitting device according to the second embodiment, and shows a cross-section taken along line VIB-VIB in FIG. 5.
Figure 7:
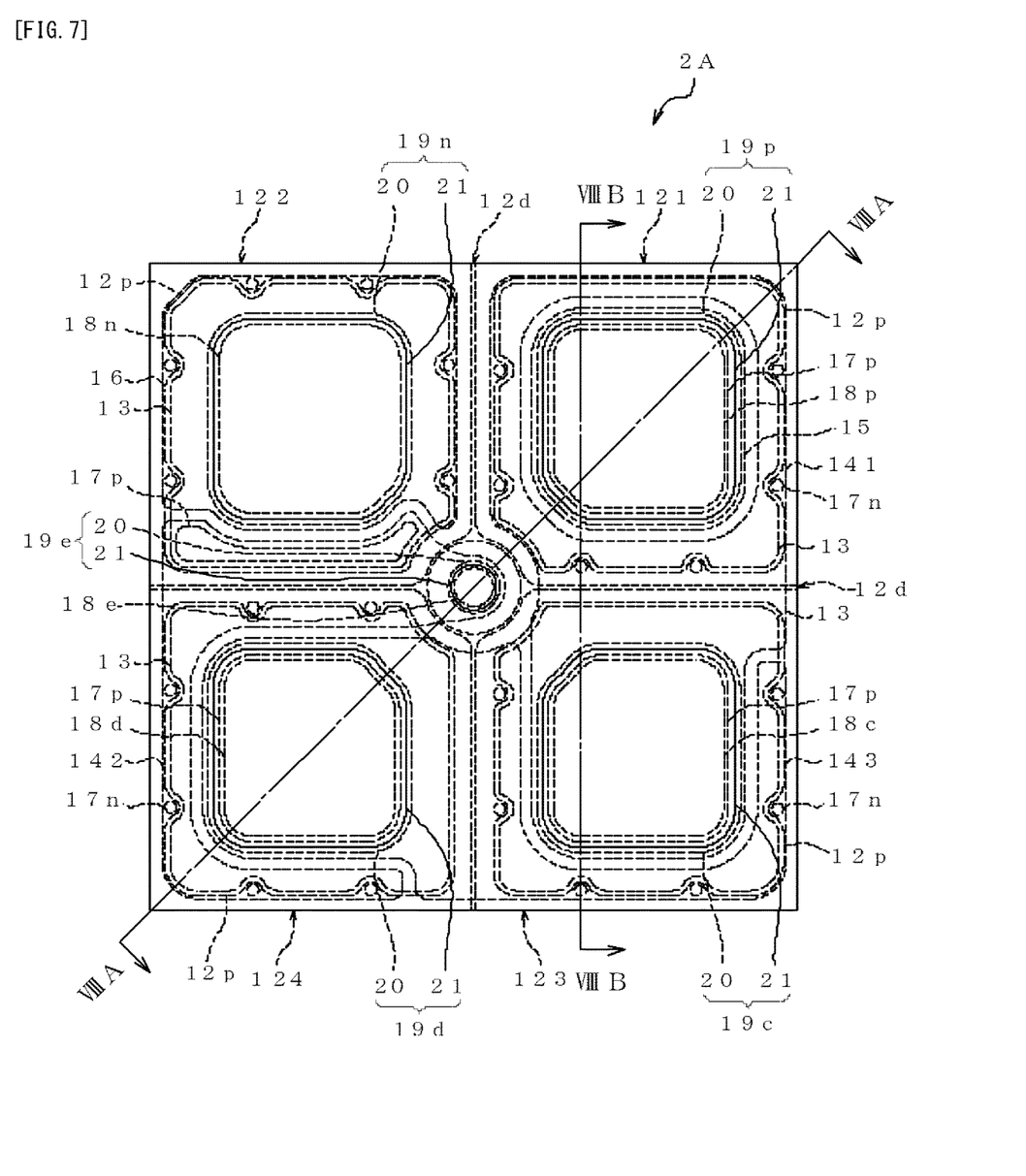
FIG. 7 is a top view schematically showing a configuration of a light emitting element according to a third embodiment.
Figure 8A:
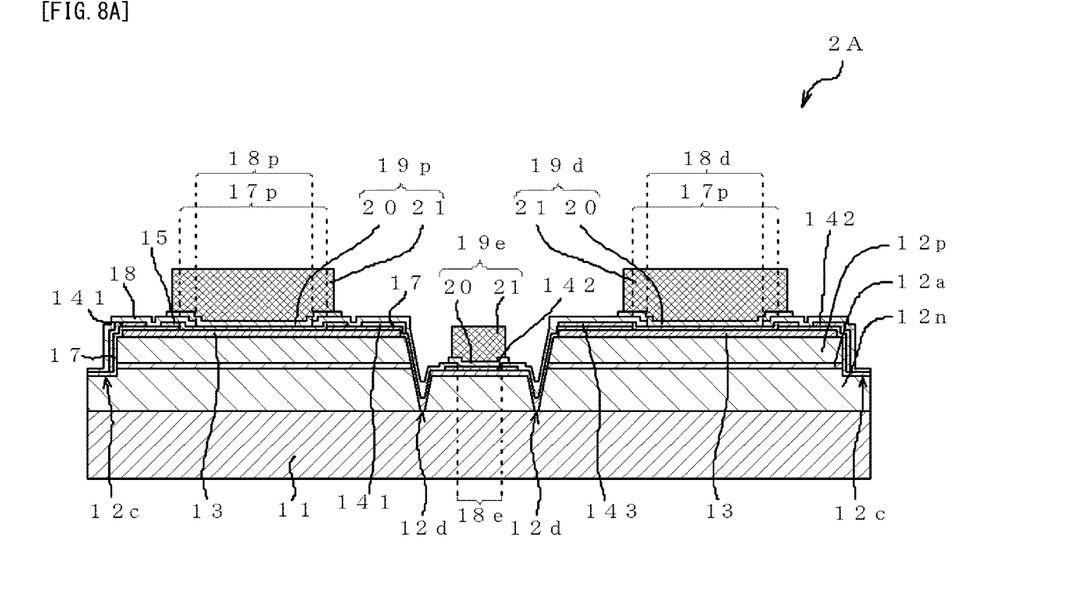
FIG. 8A is a sectional view schematically showing the configuration of the light emitting element according to the third embodiment, and shows a cross-section taken along line VIIIA-VIIIA in FIG. 7.
Figure 8B:
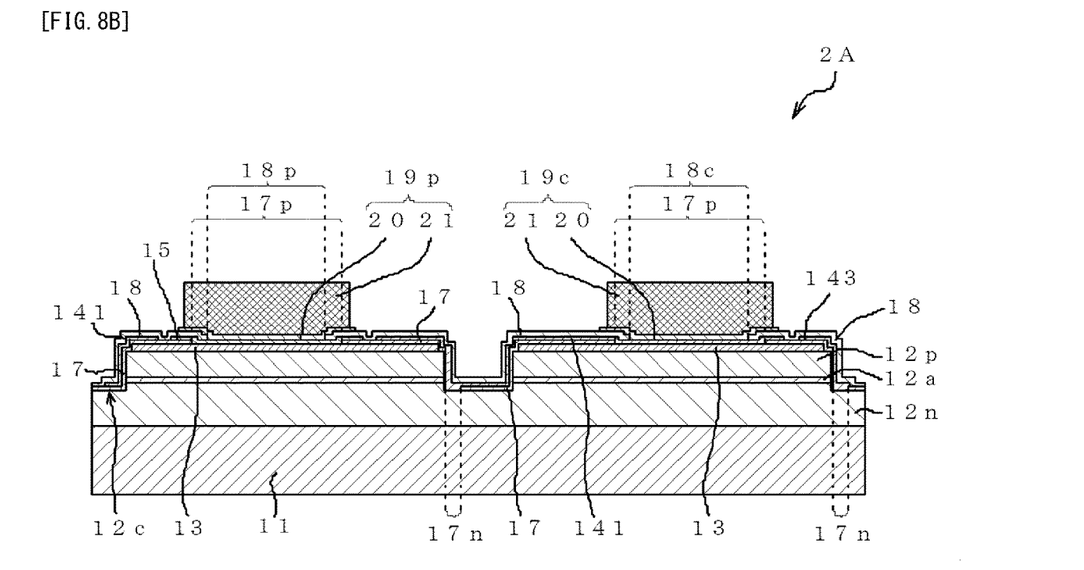
FIG. 8B is a sectional view schematically showing the configuration of the light emitting element according to the third embodiment, and shows a cross-section taken along line in FIG. 7.
Figure 9:
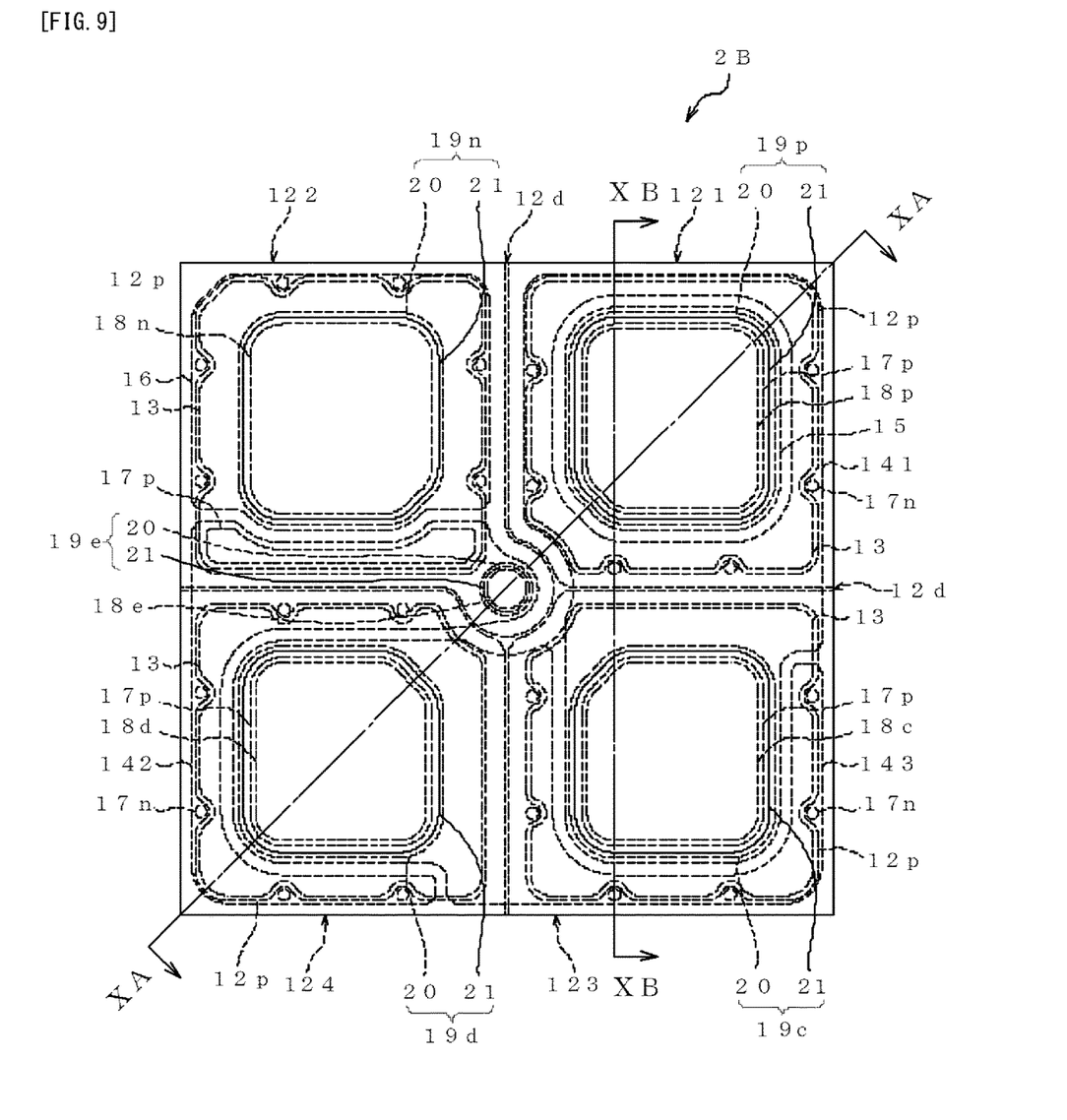
FIG. 9 is a top view schematically showing a configuration of a light emitting element according to a fourth embodiment.
Figure 10A:
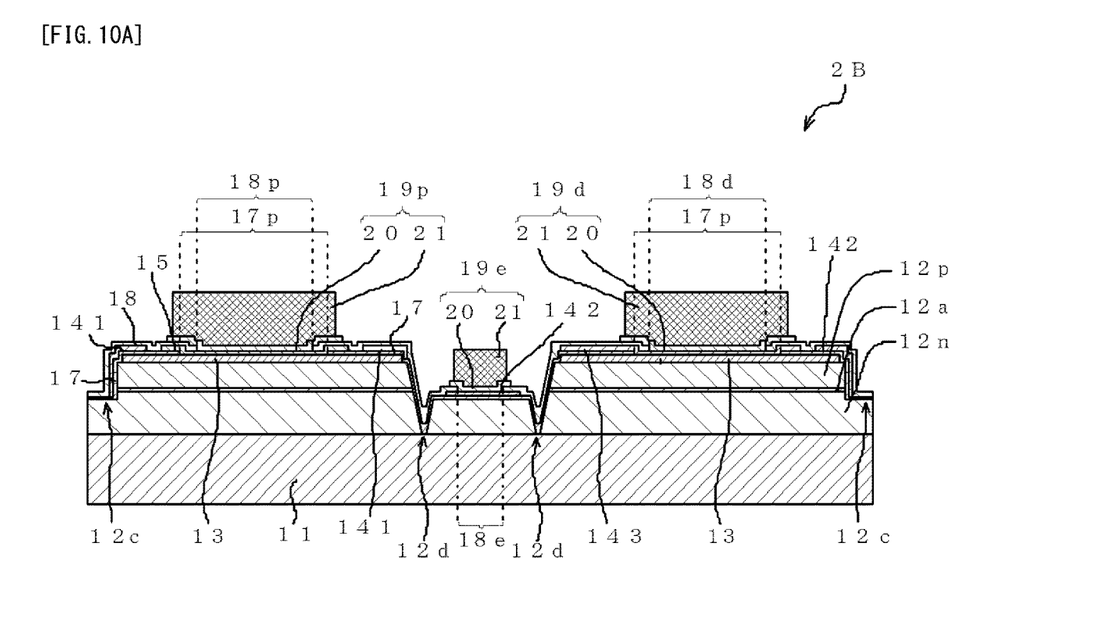
FIG. 10A is a sectional view schematically showing the configuration of the light emitting element according to the fourth embodiment, and shows a cross-section taken along line XA-XA in FIG. 9.
Figure 10B:
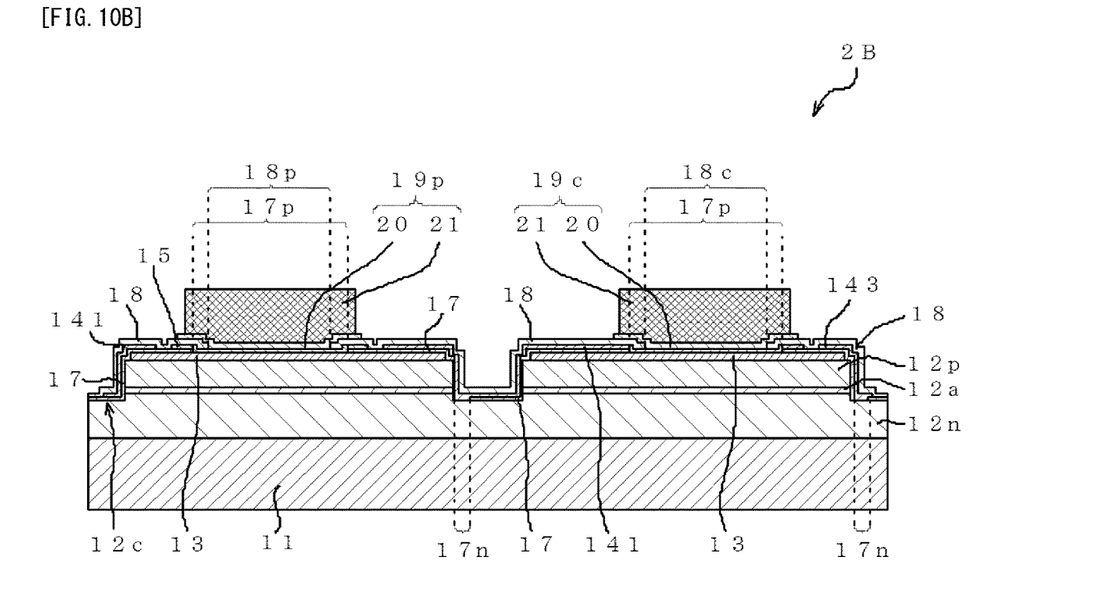
FIG. 10B is a sectional view schematically showing the configuration of the light emitting element according to the fourth embodiment, and shows a cross-section taken along line XB-XB in FIG. 9.

FIG. 1 is a top view schematically showing a configuration of a light emitting element 1A according to a first embodiment. FIG. 2A is a sectional view of the light emitting element 1A, and shows a cross-section taken along line IIA-IIA in FIG. 1. FIG. 2B is a sectional view of the light emitting element 1A, and shows a cross-section taken along line IIB-IIB in FIG. 1. FIG. 3 is a perspective view schematically showing a light emitting device 100 including the light emitting element 1A. FIG. 4 is a sectional view of the light emitting device 100, and shows a cross-section taken along line IV-IV in FIG. 3. FIG. 5 is a top view schematically showing a configuration of a light emitting element 1B according to a second embodiment. FIG. 6A is a sectional view of the light emitting element 1B, and shows a cross-section taken along line VIA-VIA in FIG. 5. FIG. 6B is a sectional view of the light emitting element 1B, and shows a cross-section taken along line VIB-VIB in FIG. 5. FIG. 7 is a top view schematically showing a configuration of a light emitting element 2A according to a third embodiment. FIG. 8A is a sectional view of the light emitting element 2A, and shows a cross-section taken along line VIIIA-VIIIA in FIG. 7. FIG. 8B is a sectional view of the light emitting element 2A, and shows a cross-section taken along line VIIIB-VIIIB in FIG. 7. FIG. 9 is a top view schematically showing a configuration of a light emitting element 2B according to a fourth embodiment. FIG. 10A is a sectional view of the light emitting element 2B, and shows a cross-section taken along line XA-XA in FIG. 9. FIG. 10B is a sectional view of the light emitting element 2B, and shows a cross-section taken along line XB-XB in FIG. 9.

In the drawings to be referred to hereinafter, the embodiments are schematically shown, and therefore the scales, intervals, positional relations and other condition of members may be exaggerated, or representation of members may be omitted. In the top views and sectional views, the scales and intervals of members may be inconsistent. In the explanations below, the same designations and reference numerals denote the same or similar members as a general rule, and repeated detailed explanations may be omitted when appropriate.

First Embodiment

The light emitting element 1A has the following configuration as FIGS. 1, 2A and 2B.

The light emitting element 1A includes an insulating substrate 11; and first and second light emitting cells 121 and 122 each including an n-side semiconductor layer $12n$ provided on an upper surface of the substrate 11, an active layer $12a$ provided on an upper surface of the n-side semiconductor layer $12n$ while being absent in some regions of the upper surface of the n-side semiconductor layer, and a p-side semiconductor layer $12p$ provided on an upper surface of the active layer $12a$. The light emitting element 1A further includes a light-reflective electrode 13 provided on an upper surface of the p-side semiconductor layer $12p$ in each of the first and second light emitting cells 121 and 122, a first insulating film 17 covering the first and second light emitting cells 121 and 122, and provided with a first p-side opening $17p$ formed above the light-reflective electrode 13 and a first n-side opening $17n$ formed above some regions of the upper surface of the n-side semiconductor layer $12n$ for each of the first and second light emitting cells 121 and 122; a wiring electrode 14 provided on an upper surface of the first insulating film 17, connected to the n-side semiconductor layer $12n$ of the first light emitting cell 121 at the first n-side opening $17n$, and connected to the light-reflective electrode 13 of the second light emitting cell 122 at the first p-side opening $17p$; a first electrode 15 provided on the upper surface of the first insulating film 17, and connected to the light-reflective electrode 13 of the first light emitting cell 121 at the first p-side opening $17p$; and a second electrode 16 provided on the upper surface of the first insulating film 17, and connected to the n-side semiconductor layer $12n$ of the second light emitting cell 122 at the first n-side opening $17n$. The light emitting element 1A further includes a second insulating film 18 provided with a second p-side opening $18p$ formed above the first electrode 15, a second n-side opening $18n$ formed above the second electrode 16, and a third opening $18e$ formed above the wiring electrode 14; a first external connection portion $19p$ connected to the first electrode 15 at the second p-side opening $18p$; and a second external connection portion $19n$ connected to the second electrode 16 at the second n-side opening $18n$.

Accordingly, even in a light emitting element in which the first light emitting cell 121 and the second light emitting cell 122 each provided on the upper surface of the substrate 11 are connected by the wiring electrode 14, electrical properties in each of the first light emitting cell 121 and the second light emitting cell 122 can be checked. This point will be described in detail below.

In a light emitting element with two light emitting cells connected by a wiring electrode, the electrical properties of the light emitting element can be checked by applying a voltage between a first external connection portion electrically connected to one light emitting cell and a second external connection portion electrically connected to the other light emitting cell. However, since the electrical properties that can be checked are those of two light emitting cells connected in series, it is difficult to check the electrical properties of each of the two light emitting cells. Thus, for example, even if one of the two light emitting cells has a defect, it may be impossible to detect the defect, resulting in lowering the reliability of the light emitting element. In particular, a very small leakage current which does not cause a variance an electrical property abnormality in a forward voltage or a reverse voltage is difficult to detect by measuring the current values in the two light emitting cells connected in series, for example, when one light emitting cell is normal. Such a leakage current is a factor of fatal reliability degradation at the time of operating the light emitting element. In addition, when a leakage current is detected by electrical properties in the forward voltage or reverse voltage of the entire light emitting element in which a plurality of light emitting cells are connected in series, an abnormality is detected from voltage drop values including the electrical properties of each light emitting cell. However, the electrical property values of the light emitting cells include a variation such as slightly larger or slightly smaller than a reference value determined to be normal, and a very small leakage current is difficult to detect due to the variation. As the number of light emitting cells connected in series increases, such a tendency becomes stronger, and it becomes more difficult to detect a very small leakage current.

Thus, in the second insulating film 18, the third opening 18e is formed above the wiring electrode 14 in addition to the second p-side opening 18p for connecting the first external connection portion 19p to the first electrode 15, and the second n-side opening 18n for connecting the second external connection portion 19n to the second electrode 16 as shown in FIGS. 1, 2A and 2B in this embodiment. Accordingly, the electrical properties of the first light emitting cell 121 can be checked by applying a voltage between the first external connection portion 19p and the wiring electrode 14 in the third opening 18e. Similarly, the electrical properties of the second light emitting cell 122 can be checked by applying a voltage between the second external connection portion 19n and the wiring electrode 14 in the third opening 18e. Thus, in the light emitting element 1A according to this embodiment, electrical properties in each of the first light emitting cell 121 and the second light emitting cell 122 can be checked. As a result, whether or not there is a defect can be accurately checked in each of the light emitting cells 12, and therefore the reliability of the light emitting element can be improved.

Hereinafter, the light emitting element 1A according to the first embodiment will be described in detail.

As shown in FIG. 1, the light emitting element 1A includes the insulating substrate 11 and first and second light emitting cells 121 and 122. The first and second light emitting cells each have the n-side semiconductor layer 12n provided on the upper surface of the substrate 11, the active layer 12a provided on the upper surface of the n-side semiconductor layer 12n while being absent in some regions of the upper surface of the n-side semiconductor layer 12n, and the p-side semiconductor layer 12p provided on the upper surface of the active layer 12a. In this embodiment, the first light emitting cell 121 and the second light emitting cell 122 are separated by a groove portion 12d. The light emitting cells 121 and 122 each have a LED structure. In addition, the first light emitting cell 121 and the second light emitting cell 122 are connected in series by the wiring electrode 14 or the like.

When the first light emitting cell 121 and the second light emitting cell 122 are connected in series, the first light emitting cell 121 is connected to the light-reflective electrode 13, the first electrode 15 and the first external connection portion 19p. In addition, the second light emitting cell 122 is connected to the second electrode 16 and the second external connection portion 19n.

The light emitting element 1A is configured such that when a power source is connected to the first external connection portion 19p and the second external connection portion 19n, the first light emitting cell 121 and the second light emitting cell 122 emit light. In addition the light-reflective electrode 13 and the wiring electrode 14 are provided on the upper surface side of the p-side semiconductor layer 12p, and light is extracted mainly from the lower surface side of the light emitting element 1A, for example, the lower surface of the substrate 11. In addition, as the first external connection portion 19p and the second external connection portion 19n are provided on the upper surface side of the light emitting element 1A, the light emitting element 1A has a structure suitable for flip-chip mounting.

Substrate

The substrate 11 is insulation member, and supports a plurality of light emitting cells 12. In addition, the substrate 11 may be a growth substrate for epitaxially growing a semiconductor layer. For example, when a nitride semiconductor is used for the semiconductor structure, a sapphire ($Al_2O_3$) substrate can be used as the substrate 11.

A plurality of projections may be provided on the upper surface of the substrate 11. The plurality of projections makes it possible to form an angle at which light from light emitting cells 12 is scattered or diffracted to be easily extracted from the light emitting element, so that light extraction efficiency can be improved. The height of the projection may be, for example, about 5 nm or more. In addition, the height of the projection is preferably lower than the total thickness of the semiconductor layered body structure provided on the upper surface of the substrate 11. The projection may have a shape appropriately determined. For example, the shape of the projection in a top view may be a circular shape, a triangular shape or a quadrangular shape.

The shape of the substrate 11 in a top view may be, for example, a rectangular shape or a square shape. In this embodiment, the substrate 11 has a substantially rectangular shape. The length of one side of the substrate 11 may be about 300 μm or more and 3000 μm or less, preferably about 500 μm or more and 1500 μm or less.

Light Emitting Cell

The light emitting cell 12 has a semiconductor layered structure in which an n-side semiconductor layer 12n, an active layer 12a and a p-side semiconductor layer 12p are stacked in this order from the upper surface side of the substrate 11. The active layer 12a is provided on the upper surface of the n-side semiconductor layer 12n while being absent in some regions of the upper surface of the n-side semiconductor layer 12n. The p-side semiconductor layer 12p is provided on the upper surface of the active layer 12a. Therefore, the active layer 12a and the p-side semiconductor layer 12p are absent in some regions of the upper surface of the n-side semiconductor layer 12n.

As shown in FIGS. 1 and 2A, the first light emitting cell 121 and the second light emitting cell 122 each provided on the upper surface of the substrate 11 are separated by the groove portion 12d in which the upper surface of the substrate 11 is exposed at the bottom. The first light emitting cell 121 and the second light emitting cell 122 are connected in series by the wiring electrode 14, but these cells are electrically independent of each other when not connected by the wiring electrode 14.

The first light emitting cell 121 and the second light emitting cell 122 are each provided with a first exposed portion 12b which is a region where the p-side semiconductor layer 12p and the active layer 12a are locally absent, and the upper surface of the n-side semiconductor layer 12n is exposed. The first exposed portion 12b is a region where a step portion between the upper surface of the p-side semiconductor later 12p and the upper surface of the n-side semiconductor layer 12n is formed in the light emitting cells 12. The first exposed portion 12b is positioned contiguous to the outer edge of the p-side semiconductor layer 12p in a top view. In this embodiment, the first light emitting cell 121 and the second light emitting cell 122 are each provided with six first exposed portions 12b.

In each of the first light emitting cell 121 and the second light emitting cell 122, a second exposed portion 12c which is a region where the n-side semiconductor layer 12 n is exposed from the p-side semiconductor layer 12p and the active layer 12a is provided along the outer periphery of the substrate 11.

Preferably, the active layers 12a of the first light emitting cell 121 and the second light emitting cell 122 have substantially the same shape in a top view as shown in FIG. 1. Having substantially the same shape of the active layers 12a is likely to provide substantially the same luminances of light emitted from the light emitting cells, so that luminance non-uniformity of the light emitting element can be alleviated.

An example material for the n-side semiconductor layer 12n, the active layer 12a and the p-side semiconductor layer 12p includes a nitride semiconductor of $In_XAl_YGa_{1-X-Y}N$ ($0 \leq X$, $0 \leq Y$, $X+Y<1$). For example, the peak wavelength of light emitted by the active layer 12a is in a range of, for example, 360 nm to 650 nm.

Light-Reflective Electrode

The light-reflective electrode 13 functions as a current diffusing layer which diffuses currents supplied from the first electrode 15, the second electrode 16 and the wiring electrode 14 so that currents flow over a wide region in the p-side semiconductor layer 12p. The light-reflective electrode 13 also functions as a light reflecting layer. The light-reflective electrode 13 is provided over substantially the entire region of the upper surface of the p-side semiconductor layer 12p in each of the first light emitting cell 121 and the second light emitting cell 122.

The light-reflective electrode 13 preferably has a metal layer containing a metallic material having good electrical conductivity and light-reflectivity. As such metallic material, for example, Ag, Al, or an alloy mainly containing one of these metals can be used. In addition, the light-reflective electrode 13 may have a layered structure in which a plurality of metal layers is stacked. For example, a light reflecting layer obtained using a material having good light-reflectivity, such as Ag or an alloy thereof, is provided on the lower layer side, and a barrier layer for reducing migration of the metallic material used for the light reflecting layer is provided on the upper layer side. The barrier layer is preferably provided so as to cover the light-reflective electrode 13. The barrier layer is preferably formed of an insulating member, and for example, SiN or $SiO_2$ can be used for the barrier layer.

First Insulating Film

As shown in FIGS. 2A and 2B, the first insulating film 17 continuously covers the first light emitting cell 121 and the second light emitting cell 122. The first insulating film 17 has the first p-side opening 17p formed above the light-reflective electrode 13 and the first n-side opening 17n formed above some regions of the upper surface of the n-side semiconductor layer 12n in each of the first light emitting cell 121 and the second light emitting cell 122. In this embodiment, the first n-side opening 17n is allocated for every six first exposed portions 12b provided in each of the light emitting cells 12. The first n-side opening 17n is formed outside the p-side semiconductor layer 12p in the first light emitting cell 121 and the second light emitting cell 122 in a top view. The first external connection portion 19p is provided inside the p-side semiconductor layer 12p in the first light emitting cell 121, and the second external connection portion 19n is provided inside the p-side semiconductor layer 12p in the second light emitting cell 122, in a top view. Accordingly, when the external connection portion 19 is provided, it can be provided in a relatively large region above the light emitting cell 12 without covering the first n-side opening 17n. When one or more of the external connection portions 19 are provided so as to cover the first n-side opening 17n, a defect may occur such as delamination of the second electrode 16 or the first insulating film 17 in the first n-side opening 17n due to, for example, thermal stress at the time of mounting. However, according to this embodiment, the external connection portion 19 can be provided over a wide range while occurrence of the defect is reduced, and therefore mountability can be improved while reliability is maintained.

Example materials for the first insulating film 17 include an oxide or nitride containing at least one selected from the group consisting of Si, Ti, Zr, Nb, Ta, Al and Hf can be used. In particular, it is preferable to use $SiO_2$ which is highly transmissive to visible light, and has a low refractive index. By using a material having a refractive index lower than that of the semiconductor structure or the base member 11 and having a large refractive index difference between the material and the semiconductor structure or the substrate 11, light can be efficiently reflected at an interface between the first insulating film 17 and the semiconductor structure or the substrate 11. Increase of the light-reflectivity at such an interface can alleviate light leakage from the upper surface side of the light emitting element 1A, in other words, light leakage from a side opposite to the light extraction surface.

Wiring Electrode

As shown in FIGS. 1, 2A and 2B, the wiring electrode 14 is provided on the first insulating film 17, and connects the first light emitting cell 121 and the second light emitting cell 122 to each other. The wiring electrode 14 is connected to the n-side semiconductor layer 12n of the first light emitting cell 121 at the first n-side opening 17n, and connected to the light-reflective electrode 13 of the second light emitting cell 122 at the first p-side opening 17p. The wiring electrode 14 is electrically connected to the p-side semiconductor layer 12p through the light-reflective electrode 13 at the first p-side opening 17p formed on the upper surface of the light-reflective electrode 13. The wiring electrode 14 is provided so as to continuously cover the upper surfaces and the lateral surfaces of the first light emitting cell 121 and the second light emitting cell 122, and regions therebetween.

The wiring electrode 14 preferably has a metal layer containing a metallic material having good electrical conductivity and light-reflectivity. Examples of the metallic material include Ag, Al or an alloy of these metals can be used. Al or an Al alloy is suitable for the wiring electrode 14 because it has high light-reflectivity, and is less likely to be migrated as compared to Ag.

First Electrode and Second Electrode

The first electrode 15 is provided on the upper surface of the first insulating film 17, and connected to the light-reflective electrode 13 of the first light emitting cell 121 at the first p-side opening 17p. The second electrode 16 is provided on the upper surface of the first insulating film 17, and connected to the n-side semiconductor layer 12n of the second light emitting cell 122 at the first n-side opening portion 17n. The second p-side opening 18p (described later) of the second insulating film 18 is formed above the first electrode 15, and the second n-side opening 18n (described later) of the second insulating film 18 is formed above the second electrode 16.

Preferably, the first electrode 15 and the second electrode 16 each have a metal layer containing a metallic material having good electrical conductivity and light-reflectivity. The metallic material used for the first electrode 15 and the second electrode 16 can be the same metallic material as that for the wiring electrode 14 described above.

Second Insulating Film

The second insulating film 18 continuously covers substantially the entire region of the surface of each of the first electrode 15, the second electrode 16, the wiring electrode 14 and the first insulating film 17 as shown in FIGS. 1, 2A and 2B. The second insulating film 18 has the second p-side opening 18p formed above the first electrode 15, the second n-side opening 18n formed above the second electrode 16, and the third opening 18e formed above the wiring electrode 14. In this embodiment, the second insulating film 18 is provided with one second p-side opening 18p and one second n-side opening 18n. The number of second p-side openings 18p and second n-side openings 18n arranged and the shape of these openings may be appropriately determined.

As shown in FIG. 1, the third opening 18e is formed in a region where the first light emitting cell 121 and the second light emitting cell 122 are absent. Accordingly, light from the light emitting cells 12 is less likely to be blocked as compared to a case where the third opening 18e is formed in a region provided with the first light emitting cell 121 and the second light emitting cell 122. In addition, it is possible to avoid a situation in which the distance between the third opening 18e and the later-described external connection portion is extremely short, so that the third opening 18e and the external connection portion are less likely to be electrically connected to each other. In this embodiment, the third opening 18e is formed above the wiring electrode 14 provided on the semiconductor layer separated from the first light emitting cell 121 and the second light emitting cell 122 by the groove portion 12d. Accordingly, for example, when a plurality of projections is provided on the upper surface of the substrate 11 as described above, the wiring electrode 14 can be provided in a desired shape with less probability of breakage caused by the projections. For example, when no projections are provided on the substrate 11, the wiring electrode 14 may be provided above a region with no semiconductor layer provided, and the upper surface of the substrate 11 is exposed, and then the third opening 18e may be formed above the wiring electrode 14.

The third opening 18e is formed in a region where the first external connection portion 19p and the second external connection portion 19n face each other as shown in FIGS. 1 and 2A. Accordingly, the distance between the third opening 18e and the first external connection portion 19p is easily made equivalent to the distance between the third opening 18e and the second external connection portion 19n. Thus, measurement can be easily performed between the third opening 18e and the first external connection portion 19p, and between the third opening 18e and the second external connection portion 19n.

The second insulating film 18 also functions a protective film which protects the first electrode 15, the second electrode 16 and the wiring electrode 14. The second insulating film 18 can be formed using the same material as that for the first insulating film 17 described above. The second insulating film 18 can be formed using different materials from those of the first insulating film 17 and the second insulating film 18.

External Connection Portion

As shown in FIGS. 1, 2A and 2B, the first external connection portion 19p is provided on the upper surface of the second insulating film 18, and connected to the first electrode 15 at the second p-side opening 18p. The second external connection portion 19n is provided on the upper surface of the second insulating film 18, and connected to the second electrode 16 at the second n-side opening 18n. The first external connection portion 19p and the second external connection portion 19n are provided to be connected to the outside. For example, these external connection portions are electrically connected to electrically conductive portions 24 of a base member 23 as described later.

The third opening 18e is formed to connect a fifth external connection portion 19e and the wiring electrode 14. This can decrease a height difference of the the fifth external connection portion 19e with respect to the first external connection portion 19p and second external connection portion 19n. As a result, in measurement of electrical properties using a probe needles or the like, the probe needles are easily brought into contact with the external connection portions 19, and therefore the measurement can be easily performed. Unlike the first external connection portion 19p and the second external connection portion 19n, the fifth external connection portion 19e is a member for measurement which is brought into contact with a probe needle or the like in measurement of the electrical properties of the light emitting cells 12, but not a member to be provided for electrical connection to the electrically conductive portions 24 of the base member 23. The size of the fifth external connection portion 19e is preferably smaller than the size of each of the first external connection portion 19p and the second external connection portion 19n, in a top view. This can allow the fifth external connection portion 19e to serve as a member for measurement, and can increase the size of areas where the first external connection portion 19p and the second external connection portion 19n are provided, so that mountability and heat dissipation can be improved.

As shown in FIG. 1, the first external connection portion 19p and the second external connection portion 19n have substantially the same shape in a top view. Such a shape can alleviate stress generated during mounting to be unevenly applied on the first external connection portion 19p side or the second external connection portion 19n side thereby improved mounting accuracy.

In the shape of the first external connection portion 19p in a top view, a portion facing a region provided with the fifth external connection portion 19e is recessed toward a side farther from the fifth external connection portion 19e as shown in FIG. 1. Similarly in the shape of the second external connection portion 19n in a top view, a portion facing a region provided with the fifth external connection portion 19e is recessed toward a side farther from the fifth external connection portion 19e. Such a shape can make it possible to relatively increase the distances from the fifth external connection portion 19e to each of the first external connection portion 19p and the second external connection portion 19n. This can alleviate unintended electrical connection between the fifth external connection portion 19e and the first external connection portion 19p, and between the fifth external connection portion 19e and the second external connection portion 19n by bonding material such as solder used in mounting.

In this embodiment, the first external connection portion 19p and the second external connection portion 19n are formed by a plating method. The first external connection portion 19p and the second external connection portion 19n each include a seed layer 20 as a metal layer electrically connected to the first electrode 15 or the second electrode 16, and a plated layer 21 stacked and formed on the upper surface of the seed layer 20. The seed layer 20 is a metal layer serving as a current path in formation of the plated layer 21 by an electroplating method, and can be formed by a sputtering or a vapor deposition method.

The seed layer 20 preferably includes a metal layer composed of a metallic material having good electrical conductivity and light-reflectivity. Examples of the metallic material may include Al, Ag, Al alloys and Ag alloys. Preferably, the seed layer 20 is provided in such a manner that the metal layer composed of Al, Ag, an Al alloy or an Ag alloy is in contact with the second insulating film 18. Accordingly, light traveling toward the base member 23 side from the semiconductor structure can be efficiently reflected toward the light extraction surface side of the light emitting element 1A.

A metal such as Cu, Au or Ni can be used for the plated layer 21. The plated layer 21 may have a layered structure using a plurality of metals. At least the outermost layer of the external connection portion 19 is preferably formed of Au for preventing or discouraging corrosion and improving bondability to the base member 23 formed of a material comprising an Au alloy-based adhesive member such as Au—Sn eutectic solder.

The lower surface of the substrate 11 can be provided with a reflecting film which reflects light from the active layer 12a. For the reflecting film, a metal film having a high reflectivity to light from the active layer 12a, or a dielectric multilayer film obtained by stacking a plurality of dielectric layers can be used. The dielectric multilayer film is preferably one in which the thickness of each dielectric layer is appropriately set so that light from the active layer 12a is reflected. When such a reflecting film is provided, light is extracted mainly from the lateral surface side of the substrate 11 while less light is extracted from the lower surface side of the substrate 11, and for example, the reflecting film can be suitably used in the case where light is to be extracted to the lateral side rather than the front side of the light emitting element.

A light emitting device 100 including the light emitting element 1A is described with reference to FIGS. 3 and 4. FIG. 3 is a perspective view showing a configuration of the light emitting device 100, and FIG. 4 is a sectional view taken along line IV-IV in FIG. 3.

Base Member and Electrically Conductive Portions

As shown in FIG. 4, the base member 23 and the electrically conductive portions 24 are integrally formed, and the light emitting element 1A is bonded to be electrically conducted with the electrically conductive portions 24. In this embodiment, the base member 23 is provided with two electrically conductive portions 24, and the first external connection portion 19p and the second external connection portion 19n are respectively bonded to the electrically conductive portions 24. The light emitting element 1A can be used as the light emitting device 100 after being bonded to the base member 23. As for surfaces of the electrically conductive portions 24, a surface opposite to a surface on which the light emitting element 1A is bonded in FIG. 4 is mounted on a mounting substrate or the like.

Materials for bonding the external connection portion 19 to the electrically conductive portion 24 can be, for example, a bonding material such as Au—Sn-based solder or Ag—Sn-based solder.

For the base member 23, a thermosetting resin or a thermoplastic resin can be used. Specifically, epoxy resin or silicone resin can be used. In addition, the base member 23 may contain a light-reflective substance. As the light-reflective substance, titanium oxide, silicon oxide, zirconium oxide or the like can be used.

Example materials for the electrically conductive portions 24 include Cu having good heat dissipation property, or a metallic material mainly composed of Cu. A metal layer may be formed on surfaces of the electrically conductive portions 24. For example, a metal layer composed of a metallic material such as Ag or Al can be formed on the outermost surfaces of the electrically conductive portions 24.

Light Reflecting Member

The light-reflective member 25 is provided to cover surfaces except the upper surface of the light emitting element 1A as shown in FIG. 4. The light-reflective member 25 is provided to reflect light, which is leaked toward the base member 23 side, to the light extraction surface side of the light emitting element 1A. Example materials for the light-reflective member 25 include the same material as the base member 23 described above, and a resin containing a light reflecting substance.

Encapsulant

An encapsulant 26 is provided to cover the light extraction surface side of the light emitting element 1A as shown in FIGS. 3 and 4. The encapsulant 26 protects the light emitting element 1A from an external force, dust, moisture and the like, and improves the heat resistance, weather resistance and light resistance of the light emitting element 1A. The same member as the base member 23 described above is preferably used for the encapsulant 26.

While the light emitting element 1A has been described above, the shape of the light emitting cell 12 in a top view may be appropriately determined, for example, a polygonal shape such as a square shape or hexagonal shape, a circular shape or an elliptic shape. The number of light emitting cells 12 may be appropriately determined, for example, 2 and 2 or more. All of the light emitting cells are not necessarily connected in series. One or more sets of two or more light emitting cells 12 may be connected in series, and some of the light emitting cells 12 may be connected in parallel.

Second Embodiment

A light emitting element 1B according to a second embodiment of the present disclosure will be described with reference to FIGS. 5, 6A and 6B. Hereinafter, members corresponding to those in the first embodiment are given the same symbols as in the first embodiment.

The light emitting element 1B is different from the first embodiment mainly in that a third opening 18e is positioned on an n-side semiconductor layer 12n continuing from a second light emitting cell 122. Accordingly, in comparison with the first embodiment, a part of a wiring electrode 14 can be provided on a region where a groove portion 12d is absent. When the groove portion 12d is formed, the wiring electrode 14 covers a large step of the groove, thereby easily cause a factor of disadvantage such as breakage of the wiring electrode 14. This may result in reliability degradation. However, in this embodiment, the size of the region of the wiring electrode 14 provided on the groove portion 12d can be decreased, and therefore the reliability degradation is less likely to occur. In this embodiment, the third opening 18e is formed on the n-side semiconductor layer 12n continuing from the second light emitting cell 122, but the third opening 18e may be formed on the n-side semiconductor layer 12n continuing from the first light emitting cell 121.

The light emitting element 1B can exhibit the same effect as that of the light emitting element 1A. It is needless to say that the light emitting element 1B can be used as a light emitting device 100 after being bonded to a base member 23 as in the case of the light emitting element 1A.

Third Embodiment

A light emitting element 2A according to a third embodiment of the present disclosure is described with reference to FIGS. 7, 8A and 8B. Hereinafter, members corresponding to those in the first embodiment are given the same symbols as in the first embodiment. The descriptions of the same configurations as in the first embodiment are appropriately omitted.

As shown in FIGS. 7, 8A and 8B, the light emitting element 2A includes an insulating substrate 11, three or more light emitting cells 121 to 124 connected in series. The three or more light emitting cells 121 to 124 include a first light emitting cell 121 positioned at one end of a series circuit, and a second light emitting cell 122 positioned at the other end of the series circuit. The three or more light emitting cells 121 to 124 each have an n-side semiconductor layer 12n provided on an upper surface of the substrate 11, an active layer 12a provided on an upper surface of the n-side semiconductor layer 12n while being absent in some regions of the upper surface of the n-side semiconductor layer 12n, and a p-side semiconductor layer 12p provided on an upper surface of the active layer 12a. The light emitting element 2A further includes a light-reflecting electrode 13, a first p-side opening 17p, a first insulating film 17, a plurality of wiring electrodes 141 to 143, a first electrode 15, and a second electrode 16. The light-reflective electrode 13 is provided on an upper surface of the p-side semiconductor layer 12p in each of the three or more light emitting cells 121 to 124. The first insulating film 17 covers the three or more light emitting cells 121 to 124, and is provided with a first p-side opening 17p formed above the light-reflective electrode 13 and a first n-side opening 17n formed above some regions of the upper surface of the n-side semiconductor layer 12n for each of the three or more light emitting cells 121 to 124. The plurality of wiring electrodes 141 to 143 is provided on an upper surface of the first insulating film 17, and includes a first wiring electrode 141 connected to the n-side semiconductor layer 12n of the first light emitting cell 121 at the first n-side opening 17n, and a second wiring electrode 142 connected to the light-reflective electrode 13 of the second light emitting cell 122 at the first p-side opening 17p. The first electrode 15 is provided on the upper surface of the first insulating film 17, and connected to the light-reflective electrode 13 of the first light emitting cell 121 at the first p-side opening 17p. The second electrode 16 is provided on the upper surface of the first insulating film 17, and connected to the n-side semiconductor layer 12n of the second light emitting cell 122 at the first n-side opening 17n. In addition, the light emitting element 2A includes: a second insulating film 18 having a second p-side opening 18p formed on the first electrode 15 and a second n-side opening 18n formed on the second electrode 16, and a third opening 18e formed on at least one of a plurality of wiring electrodes 141 to 143; a first external connection portion 19p connected to the first electrode 15 at the second p-side opening 18p; and a second external connection portion 19n connected to the second electrode 16 at the second n-side opening 18n.

This embodiment is different from the first embodiment mainly in that first to fourth light emitting cells 121 to 124 are provided in two rows and two lines on the upper surface of the substrate 11 having a substantially square shape in a top view, and first to fourth light emitting cells 121 to 124 are connected by a plurality of wiring electrodes 141 to 143. The first wiring electrode 141 is connected to the n-side semiconductor layer 12n of the first light emitting cell 121 at the first n-side opening 17n, and connected to the light-reflective electrode 13 at the first p-side opening 17p. The light-reflective electrode 13 is provided on the upper surface of the third light emitting cell 123. The second wiring electrode 142 is connected to the n-side semiconductor layer 12n of the fourth light emitting cell 124 at the first n-side opening 17n, and connected to the light-reflective electrode 13 at the first p-side opening 17p. The light-reflective electrode 13 is provided on the upper surface of the second light emitting cell 122. The third wiring electrode 143 is connected to the n-side semiconductor layer 12n of the third light emitting cell 123 at the first n-side opening 17n, and connected at the first p-side opening 17p to the light-reflective electrode 13 provided on the upper surface of the fourth light emitting cell 124. Thus, first to fourth light emitting cells 121 to 124 are connected in series by first to third wiring electrodes 141 to 143.

First to fourth light emitting cells 121 to 124 are each provided with six first exposed portions 12b. Regions provided with first exposed portions 12b are each formed with the first n-side opening 17n. The first n-side opening 17n is formed outside the p-side semiconductor layer 12p in each of first to fourth light emitting cells 121 to 124. The first external connection portion 19p is provided inside the p-side semiconductor layer 12p in the first light emitting cell 121. The second external connection portion 19n is provided inside the p-side semiconductor layer 12p in the second light emitting cell 122. A third external connection portion 19c is provided inside the p-side semiconductor layer 12p in the third light emitting cell 123. A fourth external connection portion 19d is provided inside the p-side semiconductor layer 12p in the fourth light emitting cell 124.

The light emitting element 2A includes the third external connection portion 19c, the fourth external connection portion 19d and a fifth external connection portion 19e in addition to the first external connection portion 19p and the second external connection portion 19n described in the first and second embodiments. The third external connection portion 19c is connected to the first wiring electrode 141 at a third p-side opening 18c formed above the light-reflective electrode 13 of the third light emitting cell 123. The fourth external connection portion 19d is connected to the third wiring electrode 143 at a fourth p-side opening 18d formed above the light-reflective electrode 13 of the fourth light emitting cell 124. The fifth external connection portion 19e is connected to the second wiring electrode 142 at a third opening 18e. By respectively providing these external connection portions 19 in first to fourth light emitting cells 121 to 124, the electrical properties of each of first to fourth light emitting cells 121 to 124 can be individually checked. Specifically, the electrical properties of the first light emitting cell 121 can be checked by applying a voltage between the first external connection portion 19p and the third external connection portion 19c. The electrical properties of the third light emitting cell 123 can be checked by applying a voltage between the third external connection portion 19*c* and the fourth external connection portion 19*d*. The electrical properties of the fourth light emitting cell 124 can be checked by applying a voltage between the fourth external connection portion 19*d* and the fifth external connection portion 19*e*. The electrical properties of the second light emitting cell 122 can be checked by applying a voltage between the fifth external connection portion 19*e* and the second external connection portion 19*n*.

The external connection portions 19 respectively provided in first to fourth light emitting cells 121 to 124 are respectively connected to the electrically conductive portions 24. Thus, the mounting surface of the light emitting element 2A is less likely to be inclined with respect to the mounting surface of the mounting surface in a mounting process. In addition, it is preferable that the external connection portions 19 provided, respectively, in first to fourth light emitting cells 121 to 124 has the same height, so that the light emitting element 2A can be mounted while being inclined at a further reduced angle with respect to the mounting surface.

The first external connection portion 19*p*, the second external connection portion 19*n*, the third external connection portion 19*c* and the fourth external connection portion 19*d* have substantially the same shape one another in a top view. Such a shape can alleviate stress generated during mounting to be unevenly applied on any of the external connection portions 19, thereby improving mounting accuracy.

The active layers of first to fourth light emitting cells 121 to 124 have substantially the same shape in atop view. This can reduce luminance non-uniformity between the light emitting cells 12, and disposing the first to fourth light emitting cells 121 to 124 in two rows and two lines can improve luminance uniformity as an overall light emitting element.

In this embodiment, the third opening 18*e* is formed in a region in which the first to fourth light emitting cells 121 to 124 are absent as shown in FIGS. 7, 8A and 8B. Specifically, the third opening 18*e* is formed above the second wiring electrode 142 provided on the upper surface of the semiconductor layer, and is positioned in a region surrounded by the grove portion 12*d*.

The third opening 18*e* is positioned at a central region of the substrate 11 having a substantially square shape in a top view. When the active layer 12*a* is positioned relatively far from the external connection portion 19 serving as a main heat dissipation path, the heat dissipation property of the light emitting element may be degraded. In this embodiment, degradation of heat dissipation property can be alleviated by disposing the third opening 18*e* on a semiconductor layer which does not include the active layer 12*a* at a central region.

The third opening 18*e* is formed in a region surrounded by the first external connection portion 19*p*, the second external connection portion 19*n*, the third external connection portion 19*c* and the fourth external connection portion 19*d*. This facilitates equalization of distances between the fifth external connection portion 19*e* provided in the third opening 18*e* and the first external connection portion 19*p*, between the fifth external connection portion 19*e* and the second external connection portion 19*n*, between the fifth external connection portion 19*e* and the third external connection portion 19*c*, and between the fifth external connection portion 19*e* and the fourth external connection portion 19*d*. Thus, a voltage can be easily applied to the external connection portions 19 at the time of checking the electrical properties of the first to fourth light emitting cells 121 to 124, and therefore the time required for checking can be reduced.

The light emitting element 2A can exhibit the same effect as that of the light emitting element 1A. In addition, it is needless to say that the light emitting element 2A can be used as a light emitting device 100 after being bonded to a base member 23 as in the case of the light emitting element 1A.

Fourth Embodiment

A light emitting element 2B according to a fourth embodiment of the present disclosure will be described with reference to FIGS. 9, 10A and 10B. Hereinafter, members corresponding to those in the first embodiment are given the same symbols as in the first embodiment. In addition, the descriptions of the same configurations as in the second or third embodiments are appropriately omitted.

The light emitting element 2B is different from the third embodiment mainly in that the third opening 18*e* is positioned on the n-side semiconductor layer 12*n* continuing from the second light emitting cell 122 as in the case of the second embodiment. Accordingly, in comparison with the third embodiment, a part of a wiring electrode 14 can be provided on a region where a groove portion 12*d* is absent, and therefore reliability degradation can be reduced. In this embodiment, the third opening 18*e* is formed on the n-side semiconductor layer 12*n* continuing from the second light emitting cell 122, but the third opening 18*e* may be formed on the n-side semiconductor layer 12*n* continuing from any of the first light emitting cell 121, the third light emitting cell 123 and the fourth light emitting cell 124.

The light emitting element 2B can exhibit the same effect as that of the light emitting element 2A. In addition, it is needless to say that the light emitting element 2B can be used as a light emitting device 100 after being bonded to a base member 23 as in the case of the light emitting element 2A.

While the light emitting elements according to the present disclosure is described in detail above by way of embodiments, the spirit of the present disclosure is not limited to the described embodiments, and should be broadly interpreted on the basis of the descriptions of claims. In addition, it is needless to say that various changes and modifications made on the basis of these descriptions are included in the spirit of the present disclosure.

What is claimed is:
1. A light emitting element, comprising:
an insulating substrate;
a first light emitting cell and a second light emitting cell each including an n-side semiconductor layer provided on an upper surface of the substrate, an active layer provided on an upper surface of the n-side semiconductor layer while being absent in some regions of the upper surface of the n-side semiconductor layer, and a p-side semiconductor layer provided on an upper surface of the active layer;
a light-reflective electrode provided on an upper surface of the p-side semiconductor layer in each of the first and second light emitting cells;
a first insulating film covering the first and second light emitting cells, provided with a first p-side opening formed above the light-reflective electrode for each of the first and second light emitting cells, and provided with a first n-side opening formed above some regions of the upper surface of the n-side semiconductor layer for each of the first and second light emitting cells;
a wiring electrode provided on an upper surface of the first insulating film, connected to the n-side semiconductor layer of the first light emitting cell at the first n-side opening of the first light emitting cell, and connected to the light-reflective electrode of the second light emitting cell at the first p-side opening of the second light emitting cell;
a wiring electrode provided on an upper surface of the first insulating film, connected to the n-side semiconductor layer of the first light emitting cell at the first n-side opening of the first light emitting cell, and connected to the light-reflective electrode of the second light emitting cell at the first p-side opening of the second light emitting cell;
a first electrode provided on the upper surface of the first insulating film, and connected to the light-reflective electrode of the first light emitting cell at the first p-side opening of the first light emitting cell;
a second electrode provided on the upper surface of the first insulating film, and connected to the n-side semiconductor layer of the second light emitting cell at the first n-side opening of the second light emitting cell;
a second insulating film provided with a second p-side opening formed above the first electrode, a second n-side opening formed above the second electrode, and a third opening formed above the wiring electrode;
a first external connection portion connected to the first electrode at the second p-side opening; and
a second external connection portion connected to the second electrode at the second n-side opening, wherein in a top view,
the first n-side opening of the first light emitting cell is formed outside the p-side semiconductor layer in the first light emitting cell,
the first n-side opening of the second light emitting cell is formed outside the p-side semiconductor layer in the second light emitting cell,
the first external connection portion is provided inside the p-side semiconductor layer in the first light emitting cell, and
the second external connection portion is provided inside the p-side semiconductor layer in the second light emitting cell.

2. The light emitting element according to claim 1, wherein the third opening is formed in a region where the first and second light emitting cells are absent.

3. The light emitting element according to claim 1, wherein the third opening is formed above any of the first and second light emitting cells.

4. The light emitting element according to claim 1, wherein the active layer of each of the first and second light emitting cells respectively have a same shape in a top view.

5. The light emitting element according to claim 1, wherein the third opening is formed in a region where the first external connection portion and the second external connection portion face each other.

6. The light emitting element according to claim 1, wherein the first external connection portion and the second external connection portion have a same shape in a top view.

7. A light emitting element, comprising:
an insulating substrate;
three or more light emitting cells connected in series, the three or more light emitting cells including a first light emitting cell positioned at one end of a series circuit and a second light emitting cell positioned at the other end of the series circuit, and each having an n-side semiconductor layer provided on an upper surface of the substrate, an active layer provided on an upper surface of the n-side semiconductor layer while being absent in some regions of the upper surface of the n-side semiconductor layer, and a p-side semiconductor layer provided on an upper surface of the active layer;
a light-reflective electrode provided on an upper surface of the p-side semiconductor layer in each of the three or more light emitting cells;
a first insulating film covering the three or more light emitting cells, provided with a first p-side opening formed above the light-reflective electrode for each of the three or more light emitting cells, and provided with a first n-side opening formed above some regions of the upper surface of the n-side semiconductor layer for each of the three or more light emitting cells;
a plurality of wiring electrodes which are provided on an upper surface of the first insulating film, and includes a first wiring electrode connected to the n-side semiconductor layer of the first light emitting cell at the first n-side opening of the first light emitting cell, and a second wiring electrode connected to the light-reflective electrode of the second light emitting cell at the first p-side opening of the second light emitting cell;
a first electrode provided on the upper surface of the first insulating film, and connected to the light-reflective electrode of the first light emitting cell at the first p-side opening of the first light emitting cell;
a second electrode provided on the upper surface of the first insulating film, and connected to the n-side semiconductor layer of the second light emitting cell at the first n-side opening of the second light emitting cell;
a second insulating film having a second p-side opening formed above the first electrode, a second n-side opening formed above the second electrode, and a third opening formed above at least one of the plurality of wiring electrodes;
a first external connection portion connected to the first electrode at the second p-side opening; and
a second external connection portion connected to the second electrode at the second n-side opening.

8. The light emitting element according to claim 7, wherein the third opening is formed in a region where the three or more light emitting cells are absent.

9. The light emitting element according to claim 7, wherein the third opening is formed above any of the three or more light emitting cells.

10. The light emitting element according to claim 7, wherein the active layer of each of the three or more light emitting cells have substantially a same shape in a top view.

11. The light emitting element according to claim 1, further comprising a fifth external connection portion connected to the wiring electrode at the third opening.

12. The light emitting element according to claim 1, wherein in a top view,
the substrate has a rectangular shape, and
the third opening is positioned at a central region of the substrate.

13. The light emitting element according to claim 12, wherein a lower surface of the substrate is provided with a reflecting film which reflects light from the active layer.

14. The light emitting element according to claim 13, wherein the reflecting film is a dielectric multilayer film in which a plurality of dielectric layers is stacked.

15. The light emitting element according to claim 2, wherein in a top view, the substrate has a rectangular shape, and
the third opening is positioned at a central region of the substrate.

16. The light emitting element according to claim 7, wherein
the three or more light emitting cells are configured with four light emitting cells provided in two rows and two lines,
the four light emitting cells include the first light emitting cell, a third light emitting cell connected to the first light emitting cell by the first wiring electrode, a fourth light emitting cell connected to the second light emitting cell by the second wiring electrode, and the second light emitting cell,
the second insulating film is provided with a third p-side opening formed above the light-reflective electrode of the third light emitting cell, and a fourth p-side opening formed above the light-reflective electrode of the fourth light emitting cell, and wherein
the light emitting element includes a third external connection portion connected to the wiring electrode at the third p-side opening, and a fourth external connection portion connected to the wiring electrode at the fourth p-side opening.

17. The light emitting element according to claim 16, wherein in a top view,
the first n-side openings of the three or more light emitting cells are formed outside the p-side semiconductor layer in the three or more light emitting cells,
the first external connection portion is provided inside the p-side semiconductor layer in the first light emitting cell,
the second external connection portion is provided inside the p-side semiconductor layer in the second light emitting cell,
the third external connection portion is provided inside the p-side semiconductor layer in the third light emitting cell, and wherein
the fourth external connection portion is provided inside the p-side semiconductor layer in the fourth light emitting cell.

18. The light emitting element according to claim 16, wherein the third opening is formed in a region surrounded by the first external connection portion, the second external connection portion, the third external connection portion and the fourth external connection portion.

19. The light emitting element according to claim 16, wherein the first external connection portion, the second external connection portion, the third external connection portion and the fourth external connection portion have the same shape in a top view.

20. A light emitting element, comprising:
an insulating substrate;
a first light emitting cell and a second light emitting cell each including an n-side semiconductor layer provided on an upper surface of the substrate, an active layer provided on an upper surface of the n-side semiconductor layer while being absent in some regions of the upper surface of the n-side semiconductor layer, and a p-side semiconductor layer provided on an upper surface of the active layer;
a light-reflective electrode provided on an upper surface of the p-side semiconductor layer in each of the first and second light emitting cells;
a first insulating film covering the first and second light emitting cells, provided with a first p-side opening formed above the light-reflective electrode for each of the first and second light emitting cells, and provided with a first n-side opening formed above some regions of the upper surface of the n-side semiconductor layer for each of the first and second light emitting cells;
a wiring electrode provided on an upper surface of the first insulating film, connected to the n-side semiconductor layer of the first light emitting cell at the first n-side opening of the first light emitting cell, and connected to the light-reflective electrode of the second light emitting cell at the first p-side opening of the second light emitting cell;
a wiring electrode provided on an upper surface of the first insulating film, connected to the n-side semiconductor layer of the first light emitting cell at the first n-side opening of the first light emitting cell, and connected to the light-reflective electrode of the second light emitting cell at the first p-side opening of the second light emitting cell;
a first electrode provided on the upper surface of the first insulating film, and connected to the light-reflective electrode of the first light emitting cell at the first p-side opening of the first light emitting cell;
a second electrode provided on the upper surface of the first insulating film, and connected to the n-side semiconductor layer of the second light emitting cell at the first n-side opening of the second light emitting cell;
a second insulating film provided with a second p-side opening formed above the first electrode, a second n-side opening formed above the second electrode, and a third opening formed above the wiring electrode;
a first external connection portion connected to the first electrode at the second p-side opening; and
a second external connection portion connected to the second electrode at the second n-side opening, wherein in a top view,
the first n-side opening of the first light emitting cell is formed outside the p-side semiconductor layer in the first light emitting cell,
the first n-side opening the second light emitting cell is formed outside the p-side semiconductor layer in the second light emitting cell,
the first external connection portion is provided inside the p-side semiconductor layer in the first light emitting cell,
the second external connection portion is provided inside the p-side semiconductor layer in the second light emitting cell, and
a third external connection portion electrically connected to the wiring electrode at the third opening.

* * * * *